United States Patent [19]

Baker

[11] 4,142,248
[45] Feb. 27, 1979

[54] ASYNCHRONOUS STORAGE LOOP TYPE BUBBLE CHIP ARCHITECTURE

[75] Inventor: David M. Baker, Poway, Calif.

[73] Assignee: Burroughs Corporation, Detroit, Mich.

[21] Appl. No.: 853,408

[22] Filed: Nov. 21, 1977

[51] Int. Cl.² .............................................. G11C 19/08
[52] U.S. Cl. ........................................ 365/15; 365/12; 365/17
[58] Field of Search ............................. 365/15, 17, 12

[56] References Cited

U.S. PATENT DOCUMENTS 4,056,812 11/1977 Bobeck et al. ........................ 365/15

Primary Examiner—James W. Moffitt
Attorney, Agent, or Firm—Joseph R. Dwyer; Mervyn L. Young; Kevin R. Peterson

[57] ABSTRACT

In a bubble memory system having storage loop architecture, means for decoupling the write-in means and the read-out means from the propagation cycle of the storage loops so that data may be transferred in and out of said storage loops independently of each other and of the propagation cycle thus decreasing the access time of a bubble memory.

6 Claims, 1 Drawing Figure

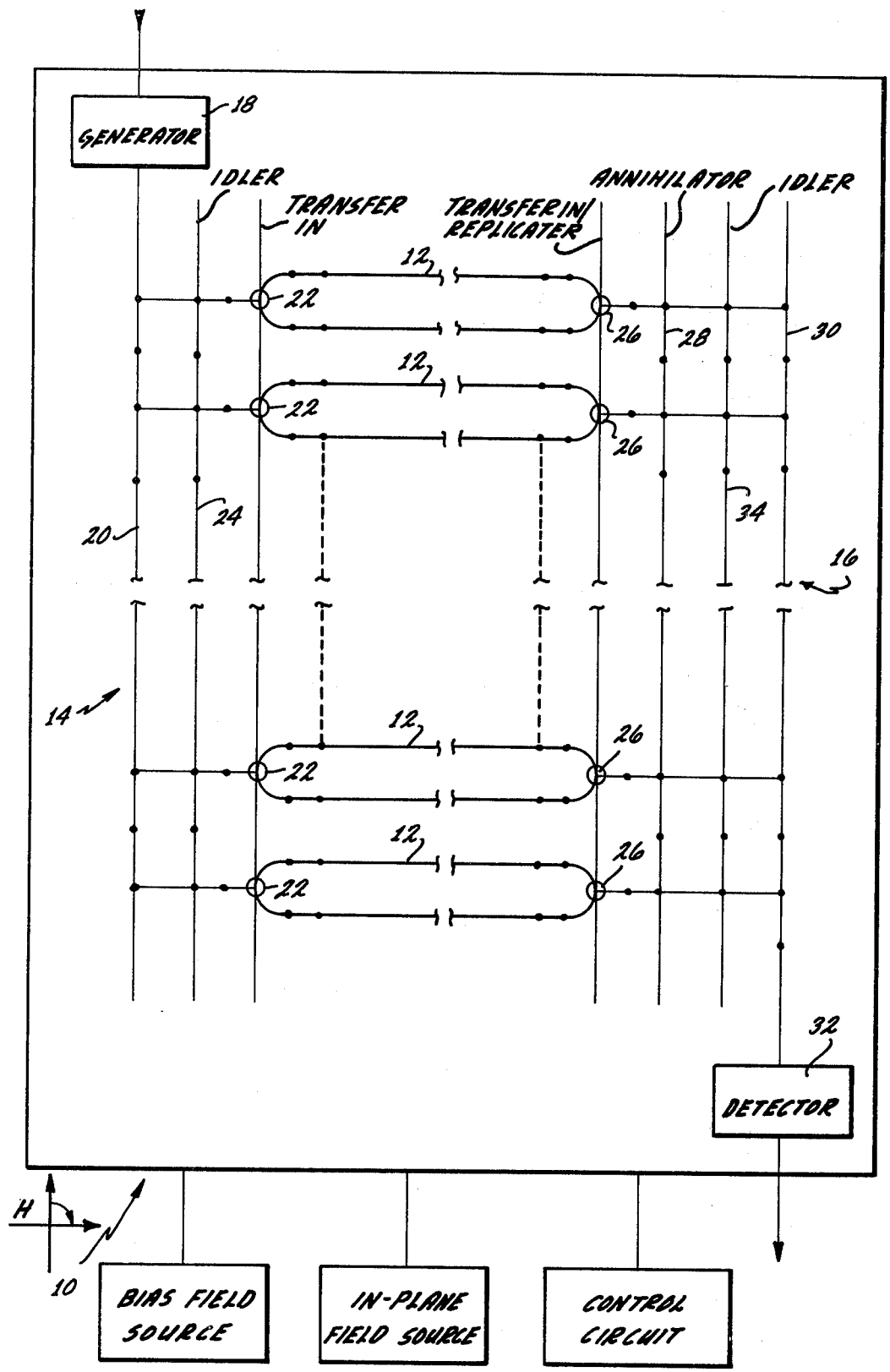

ASYNCHRONOUS STORAGE LOOP TYPE BUBBLE CHIP ARCHITECTURE

RELATED APPLICATIONS

This application is related to an application entitled, "On Chip Buffering for Optimizing Performance of a Bubble Memory", Ser. No. 853,382, filed Nov. 21, 1977 by the same inventor, David M. Baker, and assigned to the same assignee.

BACKGROUND OF THE INVENTION

1. Field of the Invention

This invention relates to bubble (magnetic domain) memories and more particularly to a storage loop bubble memory organization with asynchronous means for transferring bubbles in and out of said loops for improved performance.

2. Prior Art

Bubble memories on which conditions exist for establishing single wall domains on a suitable magnetic material such as an epitaxial magnetic garnet film on a nonmagnetic substrate are well known. Magnetically soft overlay material in the form of propagate elements are typically arranged in a series of identical storage loops forming a memory organization in which bubbles propagate from one propagate element to another around these loops by the action of an in-plane rotating magnetic field. In this arrangement transfer gates forming part of a write-in means and a read-out means transfer bubbles to and from these loops. Typically, on command, the bubbles will be transferred in parallel into the storage loops from an input track where they are then serially detected as they are propagated through a sensor which detects the presence or absence of a bubble and generates a signal as a binary "1" or a binary "0" data bit.

Although the bubble memory systems employing the storage loops of the type described have numerous economic and operational advantages, there are major shortcomings in the systems. Since a block of data bits in the form of domains are transferred serially to a position alongside the storage loops to be transferred in parallel into the loops at the appropriate time, a block of data bits must wait until all of the prior data bits in the input line are transferred into the loops. Similarly, data bits transferred out at the appropriate time in parallel from the storage loops must wait until all the prior block of data bits has been transferred serially to the sensor. While it is possible to read data from a bubble device during a write operation exact synchronization of the input/output tracks and the storage loops must take place. Also, in systems that do not employ something like swap gates, it is not possible to clear a position in the storage loops for the entry of data if the output track contains data bits.

All of this, of course, increases the steady state random access time for the bubble memory.

Accordingly, it is an object of this invention to improve the steady state random access time of a bubble memory.

SUMMARY OF THE INVENTION

According to the present invention, the magnetic domain memory architecture comprises a plurality of storage loops disposed between write-in means and read-out means. The write-in means comprises means for generating bits and propagating said bits onto input track positions adjacent to said storage loops and gate means for transferring said bits into said storage loops simultaneously, and the read-out means transfer-out transferout gate means, which may include an annihilator or swap gate and an output means including a sensor for detecting domains serially, and possibly a replicator.

However, in order to desynchronize or decouple the write-in means and the read-out means from the propagation cycle of storage loops along the data tracks, idlers are placed between the write-out means and the read-out means and the irrespective transfer gates. These idlers store the data bits awaiting transfer in or out of the storage loops, as the case may be, and act as a buffer so that the write-in means and the read-out means can process the incoming and outgoing data bits independently of the position of the bits in the storage loops.

BRIEF DESCRIPTION OF THE DRAWINGS

FIG. 1 is a plan view of a magnetic domain memory arranged for asynchronous access in accordance with the teachings of this invention.

BRIEF DESCRIPTION OF THE PREFERRED EMBODIMENT

In FIG. 1 it can be seen that there is disclosed a bubble memory organization as part of a chip 10 on which conditions exist for establishing single wall domains on a suitable magnetic material such as an epitaxial magnetic garnet film on a nonmagnetic substrate; all of which are well known in the art.

Patterns of magnetically soft overlay material form propagate elements for the propagation of domains in response to a rotating in-plane magnetic field.

A series of identical storage loops formed of these propagate elements (four loops are shown and all identified as 12) are stacked or aligned (vertically as shown in the drawings). These loops form the memory section of the chip and are located between a write section 14 and a read section 16.

In the write section 14 is a write-in means comprising a generator 18, an input track 20 and transfer-in gates 22 with an idler 24 located between the input track and gates. In the read section 16 there is a read-out means which comprises transfer-out gates 26, an annihilator 28, an output track 30, and a detector 32. Located between the transfer-out gates 26 and the output track 30 is a second idler 34. Also, there is one transfer-in and one transfer-out gate for each storage loop.

Each loop closes on itself so that circulating bubbles established in the loop, in time, circulate by propagating element to element indefinitely in response to the rotating in-plane magnetic field unless transferred out.

Also, suitable bias sources, control circuits, including auxilliary circuits such as pulsing circuits for the application of pulses to the generator, the transfer gates, the annihilator or swap gate, the idlers, etc., are well known and shown herein only by block diagrams.

The generator 18 located at the entrance to the input of track 20 generates bubble domains to be transferred serially along the input track 20. Again, in a positive logic system, for example, a bubble, or the absence of a bubble (a void) represents a binary "1" or a binary "0" bit and there is one bit position on the input track for each storage loop.

Considering the typical storage loop organization and omitting the operation of the idler 24, when the first bit of a block of bits, whether domains or voids, reaches its position opposite the entrance to the lower storage loop 12, normally a pulse on a conductor operatively connected to gates 20 will transfer the bits in parallel into all of the storage loops. Thus, circulating in the storage loops are blocks of bits representing stored binary information; one propagate element for each bit whether a bubble or a void. Also omitting consideration of idler 34, when it is desired to read data from memory, one block of bits is first transferred out through the transfer-out gates 26 by a transfer-out pulse on a conductor operatively connected to the gates. If these gates are a combined replicate and transfer-out gate, the first portion of the replicated bits will remain in the respective storage loops and the other portions of the replicated bits will be transferred onto the output track 30. Thus, if desired, a replica block of bits is transferred out of the storage loops while the original block remains in the storage loops and is continually circulated. This way information is not destroyed in the memory. On the other hand, if it is desired to erase a block of data bits, the replicate function of the transfer-out gates is not implemented and the original block is transferred to the annihilator or to a swap gate and the block annihilated leaving a position vacant for an additional block of information to be written into the storage loops.

Thus, if a block of bits is tranferred onto the output track 30, successive pulses transfer the bits along the output track 30 to the detector 32 which senses and translates the bits into electrical signals representing binary "1's" and binary "0's" to be sent to a utilization device.

Thus far described is a typical operation of a storage loop memory organization but there are certain things that should be noted at this time.

First, while the normal configuration of a storage loop organization is to have the input track and the output track adjacent the storage loops, it must be recognized that before the generator 18 can be utilized to generate data bits, all of the data bits of the prior block of bits must be transferred serially into position and transferred into the storage loops before the next block of bits can be generated and transferred onto an input track such as 20. Also, the timing of the transfer must be such that the block position of the loops is precisely located at the appropriate time to correctly receive the block to be entered from the input track. This means that the data buffer, or register, of the host system must hold the block of data bits before the generator performs the next write function. This may be several cycles about the storage loops before the write-in step is synchronized to transfer the block of bits into the loops. Thus, access time into the memory is slow in this organization. Similarly, in order for the data bits to be read out onto an output track such as 30 all of the prior block of data bits on track 30 must be cleared before the next bits can be transferred onto the track. This means that the bits to be transferred which are still circulating in the loops must wait until all of the data bits are out of the output track 30 and must also wait until they are in the precise position adjacent the transfer-out gates before being transferred out and/or replicated, as the case may be. This may take several cycles about the loops before reaching the transfer gates at the appropriate time. Again, this synchronization means a delay in the access from the memory.

In order to overcome this long access synchronization problem which existed in the prior art, idlers 24 and 34 are introduced between the input track 20 and the storage loops on the write section 14 and before the output track 30 on the read section 16. The purpose of this, of course, is to decouple the write-in means and the read-out means from the propagate cycles of the storage loops and thus make them independently operable so that data circulating in the loops is asynchronous to the write-in means and read-out means.

Idlers 24 and 34, like the input and output tracks 20 and 30, respectively, comprise a plurality of propagate elements and in the embodiment shown are located to define a line or track to receive and transfer bits from the input track and from the annihilator in parallel and are so constructed that the data transferred therein will remain, idling, so to speak, until transferred out, or allowed to be transferred out, by the rotating in-plane field. There are a number of ways to transfer or allow data to be transferred out depending upon the construction and the operation of the idlers. Numerous examples of the use of idlers are shown in the U.S. patents by way of example to Morrow, Pat. No. 3,577,131; to Danychuk, et al., U.S. Pat. No. 3,651,496; to Kluge, U.S. Pat. No. 3,770,978; and to Bonyhard, U.S. Pat. No. 3,701,132, so no further description thereof is deemed necessary herein. None of the prior art, however, utilized idlers in combination with the storage loops and write-in and read-out means in the manner herein shown. Thus, it can be appreciated that generator 18 can begin generating data which will be transferred along the input track for the next write-in step while the data in the idler 24 is held until the appropriate propagate cycle of the data storage elements be transferred into the storage gates for entry into the storage loops. Similarly, while data is being processed serially out of the output track 30, data transferred out of the transfer-out gates and past the annihilator may be held as a block in the idler 34 until the output track is cleared. Thus, the transfer gates and annihilator are cyclically independent and neither the write-in means or read-out means must wait either for one another or for the data to be transferred in or out of the storage loops thus reducing access time of the memory.

What is claimed is:

1. A bubble memory system having an in-plane rotating magnetic field for bubble propagation comprising:
   a plurality of storage loop means formed of propagate elements for supporting and propagating bubble domains from element to element responsive to the rotation of said in-plane magnetic field, and having a loop propagation cycle which depends on the number of elements in each storage loop means with an equal number of elements in each storage loop means, and wherein a bubble or the absence of a bubble constituting bits of binary information circulating in said storage loop means,
   a write section and a read section operatively located with respect to said storage loop means for writing bits into said storage loop means and for reading out bits from said storage loop means,
   the write section comprises means for generating bits, propagating means formed of propagate elements for propagating said bits serially from element to element responsive to said in-plane rotating magnetic field to provide one bit for each storage loop means in one operating cycle, and transfer-in means for transferring said bits in parallel into said storage loop means for storage therein,
   the read section comprises transfer-out means for transferring bits in parallel from said storage loop means and propagating means formed of propagate elements for receiving and propagating said bits serially from element to element responsive to said in-plane rotating magnetic field to a detector means for serially detecting bits therein, and means in said write section and in said read section for providing said sections with an operating cycle independent of the loop propagation cycle so that said section may be operated asynhronously with respect to the loop propagation cycle.

2. The bubble memory system as claimed in claim 1 wherein said means for providing said sections with an operating cycle independent of said loop propagating cycle comprises means between said propagating means and said transfer-in means in said write section for receiving bits in parallel from said propagating means and holding said bits for a selected length of time, and means between said transfer-out means and said propagating means in said read section for receving said bits in parallel from said transfer-out means and holding said bits for a selected length of time before transfer also in parallel to said receiving and propagating means.

3. The bubble memory system as claimed in claim 2 wherein said means for receiving, holding and transferring said bits comprises idler means.

4. The bubble memory system as claimed in claim 3 further including means for annihilating said bits located between said transfer-out means and said idler means for erasing unwanted bits transferred out by said transfer-out means.

5. The bubble memory system as claimed in claim 4 wherein said transfer-out means further includes a replicator.

6. A magnetic domain memory comprising:
a domain propagation structure including magnetic propagation elements disposed in an arrangement on which magnetic domains propagate in response to a rotating in-plane magnetic field, the arrangement including a plurality of storage loops of equal domain capacity which domains circulate continuously until transferred out thus forming a loop propagate cycle, a write section and read section disposed respectively on each side of the storage loops, said write section including a first track means having a domain capacity to accommodate one domain for each storage loop, means for generating domains thereon for propagation serially along said first track, transfer-in gate means for transferring domains into said loops in parallel, and idler means between said track and said transfer-in gate means for receiving domains in parallel from said track and holding same for a pre-determined period before transfer to said transfer-in gate means, said read-out section including a transfer-out gate means for transferring said domains out of said loops and a second track for receiving and propagating said domains and having a domain capacity to accommodate said domains being transferred from said loops in parallel, and sensor means for receiving and converting said domains into electrical signals as they are transferred out serially from said second track means, and idler means between said transfer-out gate means and said second track means for receiving and holding said domains in parallel for a predetermined period before transfer to said second track means, said idler means providing both said sections with a propagate cycle different from the loop propagation cycle so that said sections may be operated asynchronously with respect to said loop propagate cycle.

* * * * *